(12) United States Patent
Dietze

(10) Patent No.: US 11,525,730 B2
(45) Date of Patent: Dec. 13, 2022

(54) SENSOR AND OPERATING METHOD

(71) Applicant: OSRAM OLED GmbH, Regensburg (DE)

(72) Inventor: Daniel Dietze, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 307 days.

(21) Appl. No.: 16/649,156

(22) PCT Filed: Sep. 21, 2018

(86) PCT No.: PCT/EP2018/075623
§ 371 (c)(1),
(2) Date: Mar. 20, 2020

(87) PCT Pub. No.: WO2019/057904
PCT Pub. Date: Mar. 28, 2019

(65) Prior Publication Data
US 2020/0264041 A1    Aug. 20, 2020

(30) Foreign Application Priority Data

Sep. 22, 2017   (DE) .................... 10 2017 122 038.0

(51) Int. Cl.
*G06F 1/3234* (2019.01)
*G01J 1/44* (2006.01)
*H01L 27/146* (2006.01)

(52) U.S. Cl.
CPC ............. *G01J 1/44* (2013.01); *G06F 1/325* (2013.01); *H01L 27/14643* (2013.01)

(58) Field of Classification Search
CPC ...................................................... G06F 1/325
See application file for complete search history.

(56) References Cited

U.S. PATENT DOCUMENTS 5,013,904 A   5/1991   Muro
6,384,662 B1  5/2002   Thiel et al.
(Continued)

FOREIGN PATENT DOCUMENTS

DE    19839997 C1    6/2000
DE    20011914 U1   12/2000
(Continued)

OTHER PUBLICATIONS

German Search Report issued for corresponding DE Application No. 10 2017 122 038.0, dated Dec. 19, 2019, 5 pages (for informational purpose only).
(Continued)

*Primary Examiner* — Thanh Luu
(74) *Attorney, Agent, or Firm* — Viering, Jentschura & Partner mbB

(57) ABSTRACT

A sensor including at least one sensor chip for detecting a radiation; and an electronics unit with a digital, bidirectional connection line and with a standby control circuit, as well as with an active status line; wherein the connection line is configured to be connected to an external activation unit; and
the standby control circuit is configured to determine whether the connection line is externally addressed by the activation unit when the connection line is not addressed by the active status line, and precisely then to place the sensor in a standby mode.

17 Claims, 6 Drawing Sheets

(56) References Cited

U.S. PATENT DOCUMENTS

| | | | |
|---|---|---|---|
| 2003/0150979 A1 | 8/2003 | Lauffenburger et al. | |
| 2008/0313479 A1 | 12/2008 | Priel et al. | |
| 2011/0129229 A1 | 6/2011 | Schemmann | |
| 2012/0132791 A1 | 5/2012 | Aoki et al. | |
| 2014/0146228 A1 | 5/2014 | Tsai | |
| 2016/0087813 A1* | 3/2016 | Takai | H04L 69/08 370/338 |
| 2016/0131761 A1 | 5/2016 | Yates et al. | |

FOREIGN PATENT DOCUMENTS

| | | |
|---|---|---|
| DE | 60318180 T2 | 1/2009 |
| JP | 2008542932 A | 11/2008 |
| JP | 2009038246 A | 2/2009 |
| JP | 2014229994 A | 12/2014 |

OTHER PUBLICATIONS

International Search Report issued for corresponding PCT Application No. PCT/EP2018/075623, dated Sep. 1, 2019, 15 pages (for informational purpose only).

Notice of Allowance issued for the corresponding Japanese patent application No. 2020-516681, dated Jun. 6, 2022,2 pages (for informational purposes only).

\* cited by examiner

A)

B)

A)

B)

A)

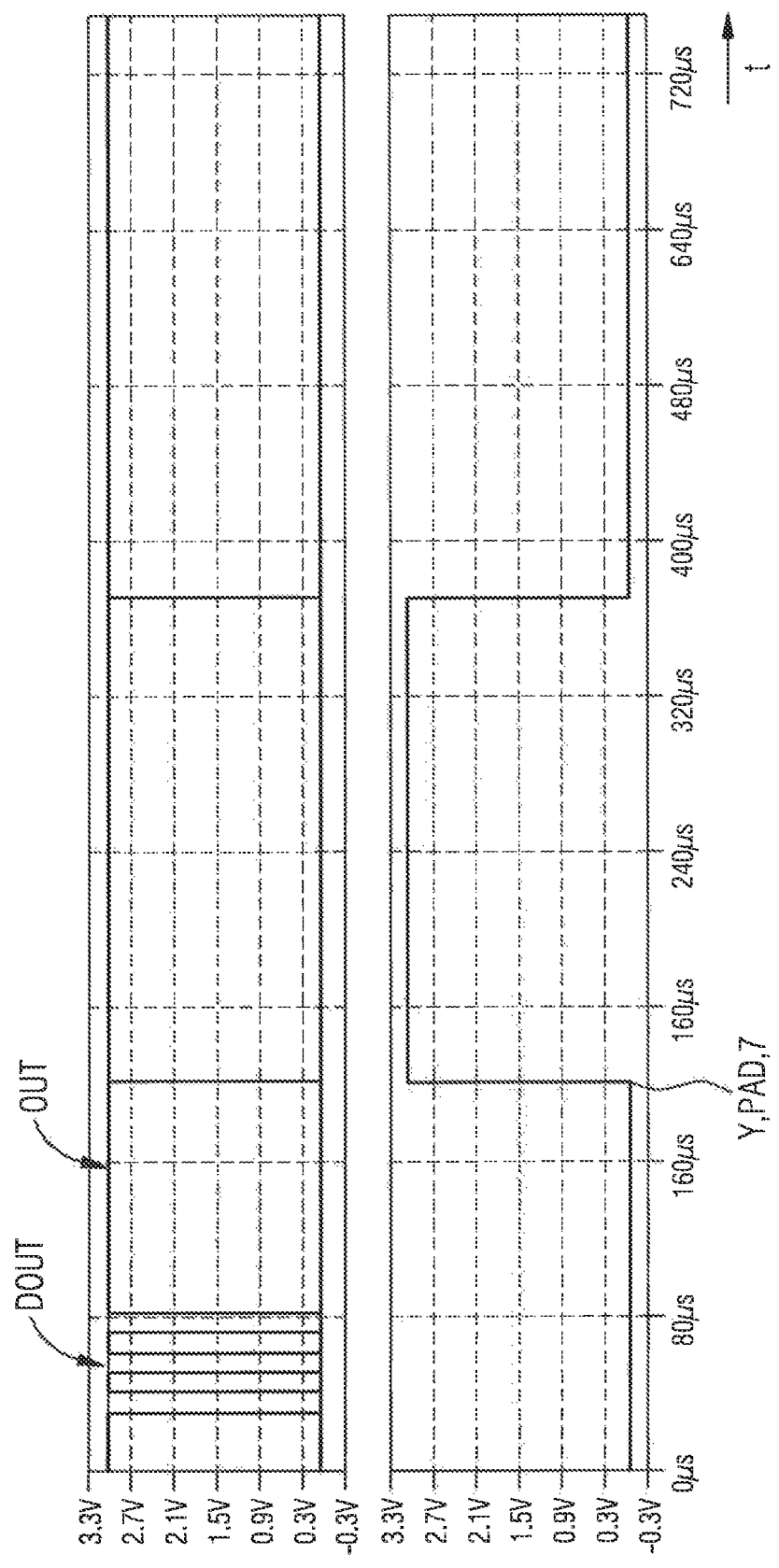

SENSOR AND OPERATING METHOD

CROSS REFERENCE TO RELATED APPLICATIONS

This application is a U.S. National Phase Application of International Application PCT/EP2018/075623, filed on Sep. 21, 2018, which claims priority to German Application, 10 2017 122 038.0, filed on Sep. 22, 2017, the contents of both of which are fully incorporated herein by reference.

BRIEF DESCRIPTION OF THE DRAWINGS

In the following a sensor described herein and an operating method described herein are described in more detail with reference to the drawing and on the basis of exemplary aspect of the disclosure. Identical reference signs indicate the same elements in the individual figures. The represented elements are not shown true to scale, however; rather, individual elements can be represented in exaggerated size for improved comprehension.

Shown are.

DETAILED DESCRIPTION

Figure 1:
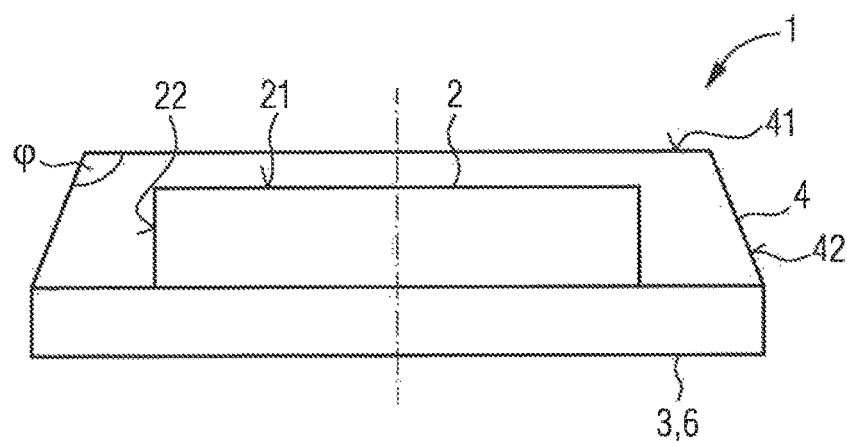
FIGS. 1 and 2 schematic sectional drawings of exemplary aspects of the disclosure of sensors described here, FIG. 3 a schematic drawing of a 3D position detection system with sensors described here, FIG. 4 schematic views from below of electrical connection points of exemplary aspects of the disclosure of sensors, FIGS. 5, 6 and 8 schematic drawings of circuits for exemplary aspects of the disclosure of sensors described here, and FIGS. 7 and 9 schematic drawings of signal waveforms of exemplary aspects of the disclosure of sensors described here.

A sensor is disclosed. In addition, an operating method for such a sensor is specified.

An object of the disclosure is to specify a sensor which has low energy consumption.

This object is achieved by, among other things, a sensor and an operating method having the features of the independent patent claims. Preferred extensions are the subject matter of the dependent claims.

In accordance with at least one aspect of the disclosure the sensor includes one or more sensor chips. The at least one sensor chip is used for the detection of a radiation. The sensor chip can be a multi-channel sensor chip or a single-channel sensor chip, also referred to as a photodiode. Preferably, the sensor chip is a single-channel photodiode, in particular a PIN photodiode. The sensor chip can be based on silicon, but also alternatively on other semiconductor material systems, such as Ge, InGaAs or InGaP.

In accordance with at least one aspect of the disclosure the sensor includes an electronics unit. The electronics unit is integrated, for example, in a carrier of the sensor. Such a carrier can be a printed circuit board and/or a circuit substrate, for example based on silicon, such as an integrated circuit, or IC for short, or a microcontroller. Alternatively, the electronic unit can be a separate component, which is mounted on the sensor chip and/or on the carrier.

In accordance with at least one aspect of the disclosure, the electronics unit contains a digital, bidirectional connection line. This means that the connection line is configured for digital signals, both in the direction away from the sensor and in the direction towards the sensor. This connection line is preferably the only bidirectional connection line of the electronics unit and the sensor. This connecting line can be the primary and/or the only data output of the sensor.

In accordance with at least one aspect of the disclosure the electronics unit includes a standby control circuit. Via the standby control circuit the sensor can be switched into an active mode in which signals are received by the sensor chip and emitted by the sensor. Furthermore, via the standby control circuit the sensor can be switched into a standby mode, also referred to as standby. In the standby mode, the sensor does not deliver any signals. In the standby mode an average energy consumption, in particular, an average current consumption, of the sensor is reduced compared to the active operation, for example by at least a factor of 10 or 100.

In accordance with at least one aspect of the disclosure the electronics unit includes an active status line. The active status line is configured to indicate whether the sensor is actively sending data. It is possible that a signal of the active status line, which is preferably a conductor or contact pad running internally in the electronics unit, is output on the connection line. In other words, the same signal can be present on the connection line and on the active status line for some of the time.

In accordance with at least one aspect of the disclosure the connection line is configured to be connected to an external activation unit. The external activation unit is preferably a field-programmable logic gate array, also known as an FPGA, or a microcontroller, or even a computer. It is possible that the signals are read out from the sensor via the activation unit. The activation unit is used to determine whether the sensor is operated in a standby mode or in an active mode. This means that the activation unit determines whether or not the sensor should collect measurement data.

In accordance with at least one aspect of the disclosure the standby control circuit is configured to determine whether the connection line is addressed externally by the activation unit when the connection line is not addressed internally by the active status line. The standby control circuit places the sensor in the standby mode precisely when the connection line is addressed by the activation unit and the active status line is not addressing the connection line.

In addition, an operating method for such a sensor is specified. With the operating method one or more sensors are operated, as specified in connection with one or more of the above-mentioned aspects of the disclosure. Features of the sensor are therefore also disclosed for the operating method and vice versa.

In at least one aspect of the disclosure of the operating method the connection line is connected to the external activation unit, which does not form part of the sensor. The standby control circuit determines, on the one hand, whether the connection line is externally addressed by the activation unit, and on the other hand, whether the connection line is addressed by the active status line. The standby control circuit places the sensor in a standby mode or outputs a corresponding control signal precisely when the connection line is not addressed by the active status line, but is externally addressed or instructed by the activation unit to go into the standby mode.

In the case of sensors, in particular optical sensors, which are used in the mobile electronics sector or in the field of electronics integrated into clothing, also known as the mobile and wearables fields, energy consumption represents a critical parameter and must be minimized in order to extend battery life or the running time of a rechargeable battery. A widely used method in these cases is to put the sensor into a standby mode when not in use, which is characterized by a much lower power consumption. With the operating method described here, the sensor can be put into a standby mode, without the need to implement elaborate additional constructional measures on the sensor.

One way of placing a sensor or an IC-based component into a standby mode is to provide an additional, dedicated connection point for the standby mode on the IC. If a voltage applied at this connection point is changed externally, for example from low to high or high to low, the standby mode is enabled or disabled. To this end, however, a dedicated physical connection must also be established between a control unit such as a controller, for example an FPGA or a microcontroller, and the standby connection point.

Another possibility is to use a sensor which has a dedicated communication interface, for example, an I2C interface. Such a sensor can be enabled and disabled directly via a communication protocol and thus switched into the standby mode. However, a communication interface with relatively complex logic units is connected to the sensor, which makes a dedicated communication interface relatively expensive.

In these implementations therefore, either an additional line is brought out to the standby connection point or else a communication interface is present, over which a relatively complex communication protocol can be processed. These requirements increase the technical complexity and/or the power consumption of the sensor. With the sensor described here, neither an additional connection point for activating the standby mode nor a communication interface with a communication protocol is required.

In the case of the sensor described here it is therefore possible to enable the standby mode via an existing digital output related to the sensor functionality, without the need to provide an additional connection to the activation unit. In a preferred aspect of the disclosure the connection line at one output is designed as a bidirectional connection in the open drain mode and, in particular, connected to a supply voltage with a pull-up resistor, for example of 10 kΩ. When the output is inactive, the pull-up resistor pulls the connection point up to a high potential, also referred to as High. As soon as the output is activated, the open drain transistor of the output stage pulls the connection point to a low potential, also referred to as Low. This allows the normal function of the digital output of the sensor to continue to be implemented without restriction.

In order to enable the standby mode, the activation unit connected thereto, preferably an FPGA or a microcontroller, must in turn pull this connection point to a low potential. A simple logic circuit in the form of the standby control circuit consisting, for example, of just three inverters, an RS flip-flop and an AND gate, then detects that the connection point is at a low potential due to the activation unit, although the output on the sensor side is inactive and therefore enables the standby mode or outputs a corresponding control command.

As soon as the activation unit enables the connection point, this is pulled back up to high potential by the pull-up resistor and the logic in the standby control circuit in the electronics unit deactivates the standby mode. Since when switching the output from active to inactive the situation can briefly arise that the connection point is still at low potential although the output is already inactive, for example, an RS flip-flop is used in order to prevent the standby mode from being activated incorrectly. The RS flip-flop preferably becomes active as soon as the output is inactive and the terminal is at high potential, corresponding to an idle mode. The standby mode is preferably not activated until then.

The sensor described here and the operating method described here therefore allow the integration of a standby mode in an integrated circuit of the sensor, in other words the electronics unit and the standby control circuit, without an additional contact pad to provide the contacting and without requiring a complex communication interface. The logic used in the sensor can also be implemented in the integrated circuit of the sensor in a space-saving and power-saving manner and can be applied in a wide range of different sensors, in particular in conjunction with different sensor chips. It is also possible that the integrated circuit of the sensor, in particular the electronics unit, and the connected activation unit can never drive the connection line in opposite directions, but only ever in the same direction. Thus, collisions between the electronics of the sensor and of the activation unit are preferably eliminated.

Especially in the case of displays for applications in the field of virtual reality, several dozen sensors are usually needed to ensure the required precision in the location determination of the display. The costs of the sensors or the complexity of additional signal lines to dedicated standby connection points therefore represent a significant cost factor of the display. With the sensor described here the interconnection complexity can be minimized while keeping the costs of the sensor relatively low.

In accordance with at least one aspect of the disclosure, the sensor is only connected by the connection line bidirectionally. In particular, the sensor therefore has no communication interface in which a communication protocol is implemented. This means, in particular, that no time signal, also known as a clock, is transmitted to the sensor. In other words, the sensor can be free of a so-called communication interface and/or an interface block.

In accordance with at least one aspect of the disclosure a potential generator is connected to the connection line, for example via a supply voltage. The potential generator is specifically in the form of a pull-up resistor, a pull-down resistor or an active current source with a limited maximum current. The potential generator allows the connection line to be pulled up to a defined potential, without signals from the activation unit or the electronics unit being present.

In accordance with at least one aspect of the disclosure, a signal which is derived from the connection line is set to a low potential when the active status line is at a high potential and/or when the activation unit is active on the connection line. This can mean that the potential generator is ineffective if the active status line and/or the activation unit are active on the connection line.

In accordance with at least one aspect of the disclosure, the signal derived from the connection line via the potential generator is set to a high potential when the active status line is at a low potential and additionally, the activation unit is inactive on the connection line. In other words, it is possible that a high potential is applied to the connection line via the potential generator when neither the active status line nor the connection line is active.

In accordance with at least one aspect of the disclosure, the standby operating mode and hence the standby mode is enabled only when the activation unit is active on the connection line. This is detected by the electronics unit of the sensor.

The above-mentioned aspects of the disclosure are described for the case that the connection line is set to a high potential by the potential generator in the idle mode. It is equally possible that in the idle mode the potential generator sets the connection point to a low potential. The above comments on the High and Low states must then be adapted accordingly.

The standby control circuit and other components of the electronics unit can be implemented in the same IC. This means that the entire electronics unit can be integrated in a single component. Alternatively, it is possible that the electronics unit is housed in a plurality of different components.

In accordance with at least one aspect of the disclosure, the potential generator is integrated in the sensor. This means that the potential generator is an integral part of the sensor and is housed, for example, in the electronics unit with the standby control circuit. Alternatively, it is possible that the potential generator is integrated in the activation unit, or else that the potential generator is a different, separate component from the activation unit and the sensor.

In accordance with at least one aspect of the disclosure, a state on the potential generator on the connection line is processed in the standby control circuit with a time delay. The time delay is achieved, for example, by means of a non-inverting Schmitt trigger, by an RS flip-flop, by a low-pass filter, by an RC element and/or by a series circuit of inverters. In the case of inverters there is preferably an even number of inverters, which are connected in series.

In accordance with at least one aspect of the disclosure a signal on the active status line is identical to an envelope of a digitized signal of the sensor chip. In other words, the active status line is preferably active precisely when digital data of the sensor chip are transmitted to the activation unit.

In accordance with at least one aspect of the disclosure, the activation unit sends the response of the connection line to the setting of the standby mode to the sensor as its only signal. In other words no other signals, such as a clock, are then sent to the sensor from the activation unit.

In accordance with at least one aspect of the disclosure, the sensor has exactly three electrical connections. In particular, in addition to the connection line two voltage terminals for a high voltage and a low voltage are present. One of the voltage terminals can be an earth terminal, also known as ground, GND or VSS.

In accordance with at least one aspect of the disclosure, the sensor has exactly four electrical connections. In particular, in addition to the connection line an additional data output line for the digitized signals of the sensor chip is present, as well as two voltage terminals for a high voltage and a low voltage. One of the voltage terminals can be an earth terminal, also known as ground, GND or VSS.

In accordance with at least one aspect of the disclosure, the connection line operates in an open-drain mode.

In accordance with at least one aspect of the disclosure a mean active time interval of the activation unit, with which the connection line is addressed by the active status line, is at least 200 µs or 2 ms or 20 ms. Alternatively or in addition, this time interval is a maximum of 1 min or 10 s. In other words, the standby mode is enabled for a long time in comparison to standard clock rates for electronic components. In particular, the activation unit does not transmit any faster modulated signals to the sensor.

In accordance with at least one aspect of the disclosure the standby control circuit has a compact electronic design. In particular, this means that the standby control circuit includes no more than 25 or 15 or 10 logic gates. For example, the standby control circuit contains exactly three inverters, exactly one RS flip-flop and exactly one AND gate and no other logic gates.

In accordance with at least one aspect of the disclosure the sensor is configured for a 3D position detection system. 3D stands for three-dimensional. This means that the sensor is designed to function as part of a position detection system. Such a 3D position detection system is used, in particular, to detect location and/or position in space of a moving component, such as a display which is worn by a user, for example, and/or of control units, such as for computer games, and therefore preferably to provide a game environment in the field of virtual reality.

In accordance with at least one aspect of the disclosure a plurality of the sensors are used in the 3D position detection system. For example, the number of the sensors is at least five or 10, or 20 or 30. Alternatively or additionally, the number of the sensors is a maximum of 200 or 100.

In accordance with at least one aspect of the disclosure the 3D position detection system includes one or more radiation sources. A plurality of radiation sources is preferably present. The at least one radiation source is configured for generating the radiation to be detected by the sensors.

In accordance with at least one aspect of the disclosure, the 3D position detection system includes at least one user device.

The user device is preferably a display device worn on the user's head, also known as a head mounted display, or HMD for short. In particular, the user device is designed for displaying three-dimensional images for applications in the field of virtual reality. Each user is preferably provided with exactly one such user device, wherein additional user devices may be present, for example in the form of so-called controllers. In the case of multiple users the user devices are preferably uniquely assigned to the respective user. There is preferably only one user present at the same time, or just two users at the same time.

In accordance with at least one aspect of the disclosure, the sensors are fitted in the user device or in the user devices. The above-mentioned numbers of sensors preferably apply per user device. The sensors are preferably installed in an irreversible manner. In particular, exactly one sensor chip is present per sensor.

In accordance with at least one aspect of the disclosure, the sensors are configured to determine angles between the user device and the radiation source. This determination of the angles allows a spatial position and/or orientation of the user device to be determined. In other words, by the interaction of the sensors with at least one radiation source a precise localization of the user device is possible, preferably in real time.

In accordance with at least one aspect of the disclosure, the 3D position detection system is a system for virtual reality, also referred to as a VR system. For example, the VR system is SteamVR-Tracking or SteamVR2 from Valve, such as used by HTC Vive. In particular, the 3D position detection system is designed as described in the publication US 2016/0131761 A1, the disclosed content of which is incorporated by reference, in particular FIGS. 8, 28a and 28b and paragraphs 81 to 89 and 122 in addition to claim 1.

In accordance with at least one aspect of the disclosure the radiation to be detected is near-infrared radiation. A wavelength of maximum intensity of the radiation is preferably located at at least 780 nm or 810 nm and/or at a maximum of 1050 nm or 940 nm or 860 nm.

In accordance with at least one aspect of the disclosure, the radiation to be detected is at least partly a laser radiation. The laser radiation preferably has a laminar form. This means that on a flat projection surface the laser radiation appears as a continuous, preferably straight line. In particular, it is scanned, as described in document US 2016/0131761 A1, see e.g. paragraph 73, whose disclosure is incorporated by reference.

In accordance with at least one aspect of the disclosure the laser radiation is a pulsed laser beam. A repetition rate of the radiation is preferably at least 1 MHz, see the document US 2016/0131761 A1, for example paragraph 83. For example, pulse lengths can be relatively long and can take minimum values of 50 ns or 100 ns or 300 ns and/or maximum values of 0.5 µs or 2 µm or 5 ps.

In accordance with at least one aspect of the disclosure, in operation the radiation is traversed over a spatial region in which the user device is located in normal operation. Preferably, a plurality of successive pulses of the laser radiation are generated. For example, such a traversal of the spatial region, also referred to as a sweep, is carried out in the vertical direction and in the horizontal direction, in particular in each case in a line-by-line manner, so that a scan line of the radiation source moves horizontally and/or vertically over the desired spatial region, see also the publication US 2016/0131761 A1, paragraphs 71 and 110, whose disclosure is incorporated by reference.

In accordance with at least one aspect of the disclosure the scanning of the spatial region is structured so that a plurality of successive pulses of the laser radiation are incident on the relevant sensor chip. This means that to determine the angle multiple laser pulses are incident on the relevant sensor chip, see also the publication US 2016/0131761 A1, such as paragraphs 84 and 119, whose disclosure is incorporated by reference.

In accordance with at least one aspect of the disclosure of the sensor chip an intensity histogram of the incident radiation, in particular pulses, is detected, see also the publication US 2016/0131761 A1, for example, paragraphs 84 and 119, whose disclosure is incorporated by reference. In other words, an intensity of consecutive pulses is measured. An evaluation of the intensities of the pulses or the temporal profile of the radiation and hence the intensity histogram can be carried out within the sensor, for example, in an electronics unit of the carrier. Alternatively, this evaluation is carried out outside of the sensor, for example in the user device or on a computer which is preferably connected to the user device via a wireless data connection. From the intensity histogram the angle relative to the associated radiation source is determined.

In accordance with at least one aspect of the disclosure the user device is a pair of virtual reality glasses with one or more displays for displaying three-dimensional images. For example, the user device can be an HMD.

FIG. 1 shows a sectional drawing of an exemplary aspect of the disclosure of a sensor 1. The sensor 1 includes a carrier 3, such as a silicon substrate. Preferably, the carrier 3 includes an electronics unit 6, for example in the form of an IC. Resting on the carrier 3 is a sensor chip 2 with a chip upper side 21 that faces away from the carrier 3 and also functions as a detection side. No signal is preferably detected via chip side walls 22. The sensor chip 2 is preferably a PIN silicon photodiode, such as BPW34S manufactured by Osram.

The sensor 1 has an encapsulated body 4. A light inlet side 41 facing away from the carrier 3 is smooth, flat and planar. An angle φ between the light inlet side and the likewise smooth, flat, and radiation-permeable side walls 42 of the encapsulated body 4 is preferably between 95° and 110°, for example 100°. The encapsulated body 4 preferably completely covers the chip upper side 21 and extends in plan view all around the sensor chip 2, in particular with a constant width.

The sensor 1 can have additional components, not drawn, such as spectral filters, so that only the radiation to be detected reaches the sensor chip 2 and other wavelengths are absorbed or reflected. For example, the encapsulated body 4 is absorbent for visible light.

Figure 2:
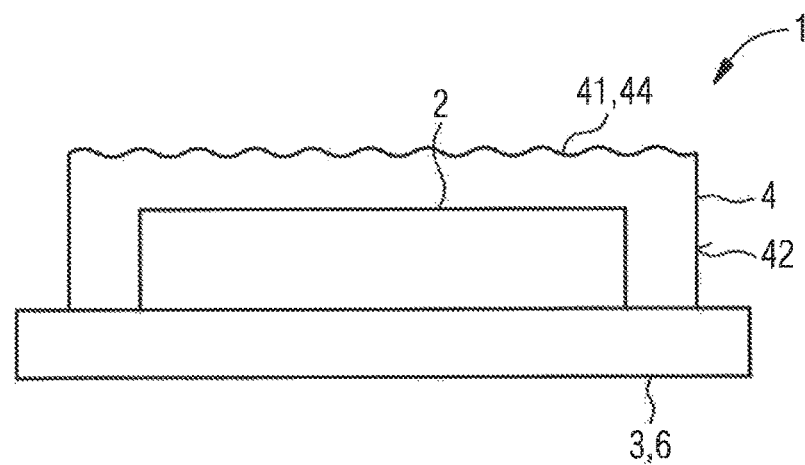

FIG. 2 shows a further exemplary aspect of the disclosure of the sensor 1. In this case the light inlet side 41 is covered over the whole surface with a roughening 44. The roughening 44 allows a Lambertian scattering of the radiation R to be obtained on an inner side of the light inlet side 41 through to the sensor chip 2. The side walls 42 are oriented perpendicular to the light inlet side 41, as may also be the case in the exemplary aspect of the disclosure of FIG. 1. For the remainder, the comments in relation to FIG. 1 also apply mutatis mutandis.

Figure 3:
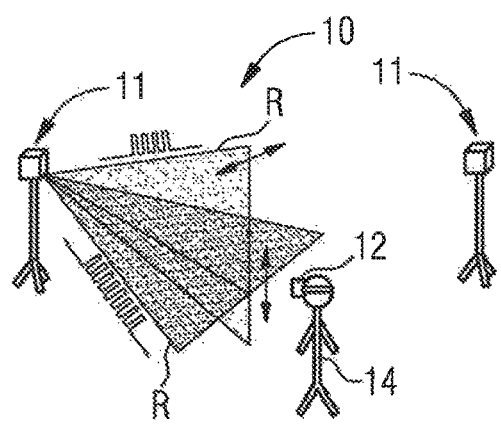
Figure 3:
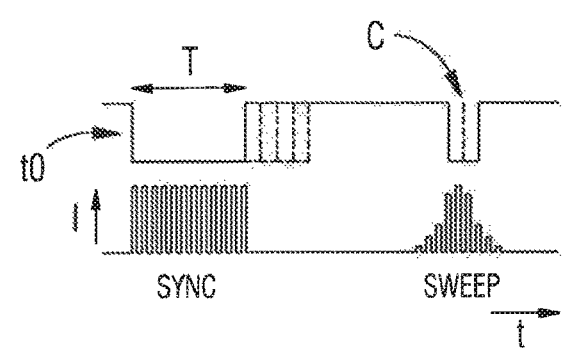

FIG. 3A illustrates a perspective view of a 3D position detection system 10. The system 10 includes a plurality of radiation sources 11, which emit a laminar laser radiation R in the near infrared spectral range horizontally and vertically and perform a vertical and horizontal line-by-line scan, also known as a SWEEP, for example with a repetition rate of 50 Hz or 60 Hz.

A user 14 carries or wears a user device 12 which includes a plurality of the sensors, wherein the sensors are not drawn in FIG. 3a. The system 10 is configured, in particular, as described in the publication US 2016/0131761 A1. This system allows a high temporal resolution so that a time difference between a movement of the user 14 and a re-detection of the position of the user 14 is relatively small, in order to minimize or to prevent the occurrence of motion sickness.

Each radiation source 11, also known as a lighthouse, emits, for example, an infrared flash with a duration T in order to define a start time to, see FIG. 3B or else FIGS. 28a and 28b together with the related description in publication US 2016/0131761 A1. The infrared flash is followed by the vertical and horizontal laser scanning. The infrared flash is also referred to as SYNC. A time difference between this SYNC and a detection time of the SWEEP allows the calculation of the angle of the relevant sensor relative to the radiation source 11.

Additional signals can be coded in a pulse length and/or pulse sequence of the infrared flash SYNC. To achieve background suppression the optical signal is preferably modulated, so that a pulse train is produced, wherein a modulation frequency is preferably at least 1 MHz. An angle between the user device 12 and the associated radiation source 11 is derived from an intensity signal I measured by the relevant sensor, in particular, from the time of a centroid C in the signal I.

Figure 4:
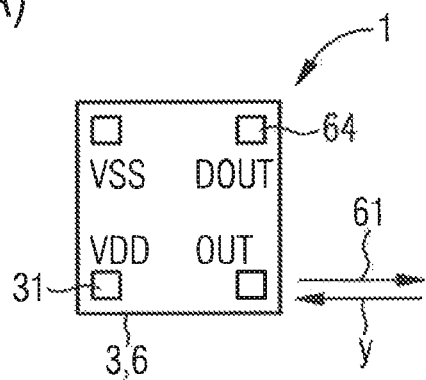
Figure 4:
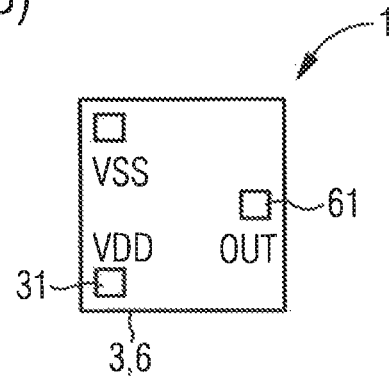

FIG. 4A shows a view from below of electrical contact pads 31 of the sensor 1. There are two contact pads 31 present for a supply voltage VSS, VDD. In addition, two data lines 61, 64 are present, also referred to as OUT and DOUT, via which the data obtained from the sensor chip 2 are output in digitized form. The data line OUT 61 is also designed as a bidirectional connection line 61, to which a signal Y can be applied.

In contrast, the sensor of FIG. 4B only has the two contact pads 31 for the supply voltage VSS, VDD and additionally the connecting line 61 as a data output line OUT. The sensor data are thus output in digitized form via the connection line 61.

Figure 5:
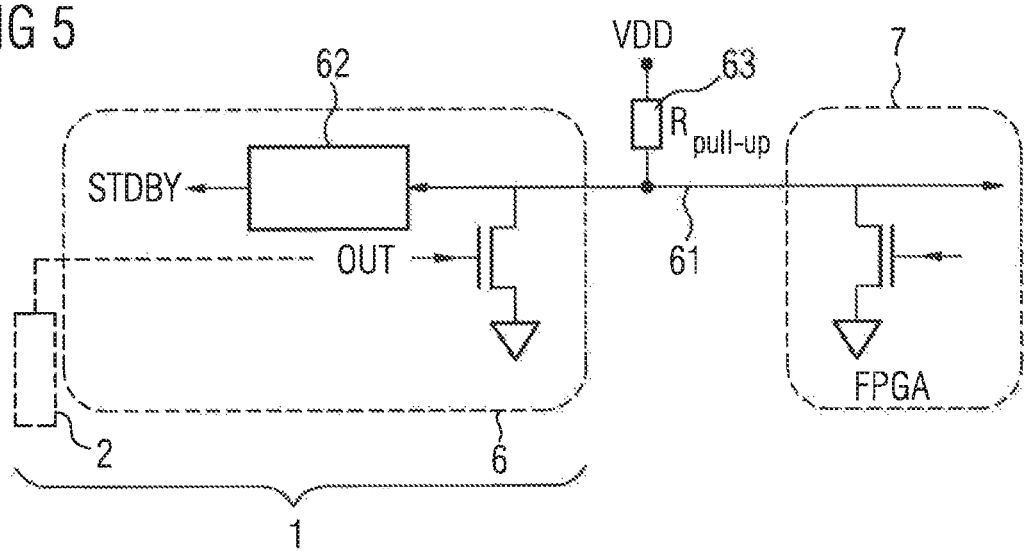

FIG. 5 shows a schematic representation of a circuit configuration for an operating method described here. The sensor 1 includes the electronics unit 6, in particular in the carrier 3. The electronic unit 6 includes a standby control circuit 62, with which the sensor 1 can be switched into a standby mode STDBY. On the connection line 61 the electronics unit 6 outputs a data envelope OUT for the digitized output data DOUT, corresponding, for example, to the active status line OUT.

The connection line 61 is tied to a pull-up resistor 63 which is connected to a supply voltage VDD. Also located on the connection line 61 is an external activation unit 7, in particular integrated into the user device 12, not illustrated in FIG. 5. The activation unit 7 is, for example, an FPGA. The sensor is thus free of a fully equipped communication interface and in particular, does not include a driver block such as an I2C unit.

The connection line 61 is preferably designed as an open-drain connection. For example, a bidirectional output driver can be used for this purpose.

Due to this structure the standby control circuit 62 can be implemented as merely a small logic block and it can be efficiently detected whether the connection point 61 is operated externally or internally, from which the conditions for activation of the standby mode are derived. An output STDBY of the standby control circuit 62 can be connected to the logic block of a standby circuit preferably already existing in the sensor.

In the aspect of the disclosure of FIG. 5 the bidirectional driver and the logic block are actively controlled by the activation unit 7 during the standby mode.

Figure 6:
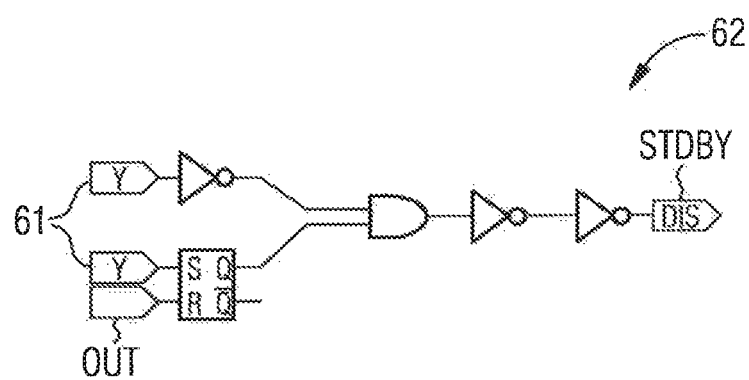

FIG. 6 shows a schematic view of a further implementation option of the standby control circuit 62. Here, via the connection line 61 a signal Y is directly injected by the potential generator 63. The signal Y is applied on the one hand to an inverter, on the other hand to an RS flip-flop, in the same way as the signal from the active status line OUT. The output of the RS flip-flop and the inverted signal Y are passed to an AND gate. Optionally, using a double inverter stage, a delay is generated in order to suppress interfering pulses. This results in a signal DIS, via which the standby mode is activated.

Figure 7:
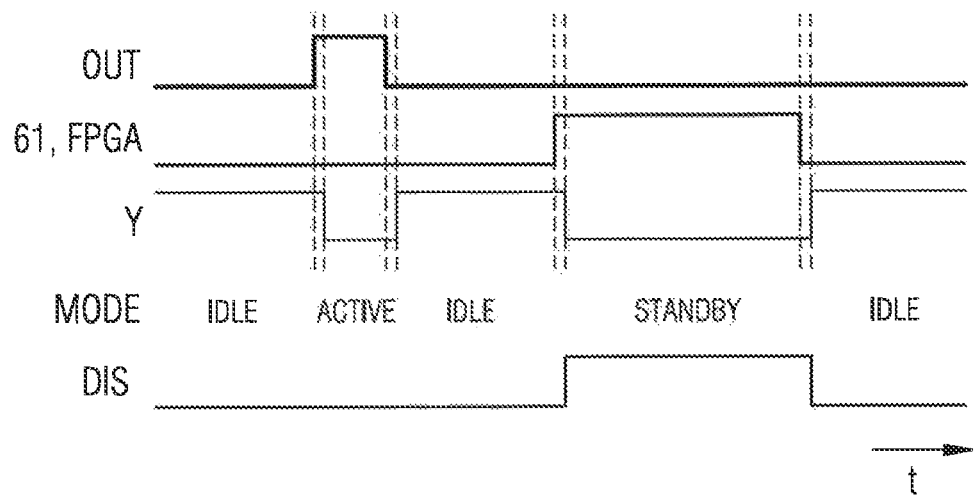

An example of a signal waveform for this case is illustrated in FIG. 7 along a time axis t. The top trace shows the signal OUT from the active status line, corresponding to an envelope within which data are present at the data output 64, DOUT. If the signal OUT is at high potential, high, the mode MODE of the sensor 1 is set to active, ACTIVE. If the signal OUT is at high, then the signal Y which is present on the connecting line 61 is pulled to a low potential, low. This occurs with a slight time delay.

In addition, the signal Y is pulled to low if the FPGA 7 sends an active signal on the connection line 61, again with a slight time delay. In this time period, if the signal of the FPGA 7 is high, the mode MODE is set to STANDBY. Otherwise the mode MODE corresponds to an idle state, IDLE. The resulting control signal DIS to activate the standby mode, compare FIG. 6, is plotted at the bottom of FIG. 7 as a time waveform.

According to FIG. 7, shortly after resetting the signal OUT to zero at the end of the ACTIVE mode, the values OUT=0=Y are present. This is the same signal configuration, OUT=0=Y, which is required in order to enable the standby mode. In order that this transition region at the end of the active mode is not misinterpreted as a signal to activate the standby mode, a filtering via an RS flip-flop is preferably carried out.

FIG. 6 shows an example of the logic circuit. Other combinations of gates are also possible, however, in order to achieve the same truth table. This allows the desired behavior to be implemented with different configurations and activations. The two inverters according to the actual logic, see FIG. 6, generate enough delay to prevent problems during the switching process, as explained in conjunction with FIG. 7. The same effect can also be achieved by a low-pass filter, such as an RC filter, instead of the two inverters.

In the exemplary aspects of the disclosure the wiring of the connection line 61 is shown as an open drain with a pull-up resistor. The same principle can also be implemented with a pull-down resistor, so that the polarity of the output can be inverted if desired. In this case, the logic circuit must be adapted accordingly. Furthermore, instead of a passive resistor for the potential generator 63 an active current source can also be used, for example by means of a transistor or a transistor circuit, in which a maximum current is limited, for example to 100 µA. The drivers 62, 7 then work against this current source as necessary, to pull the connection line 61 to earth.

Figure 8:
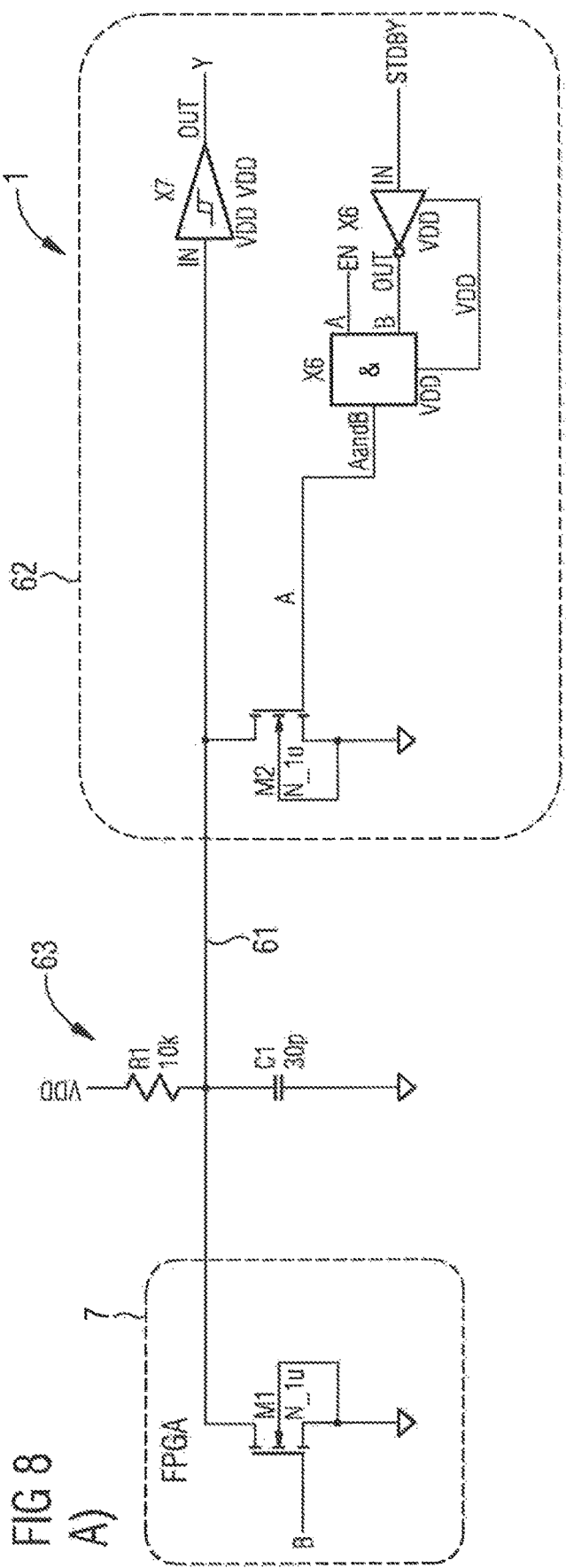
Figure 8:
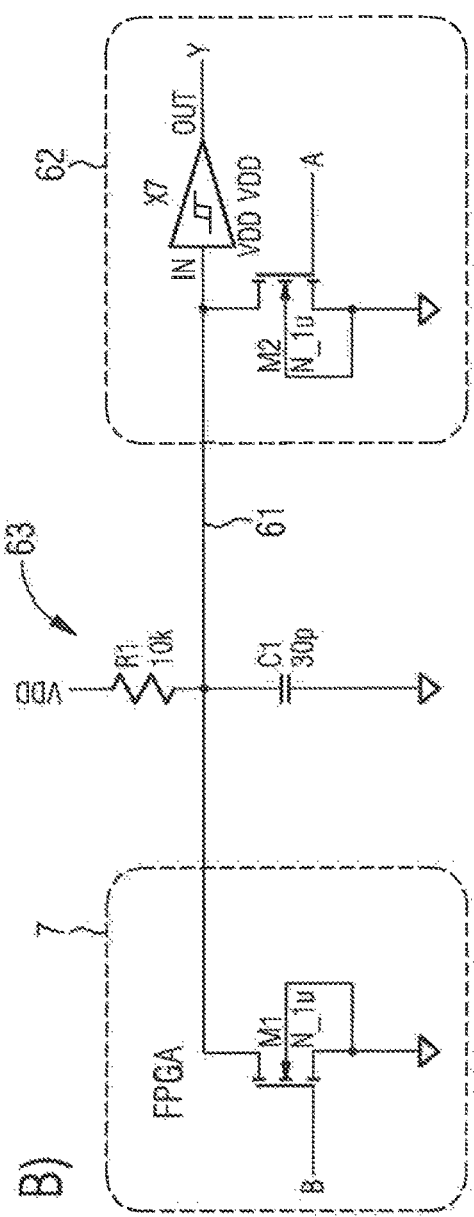
Figure 9:
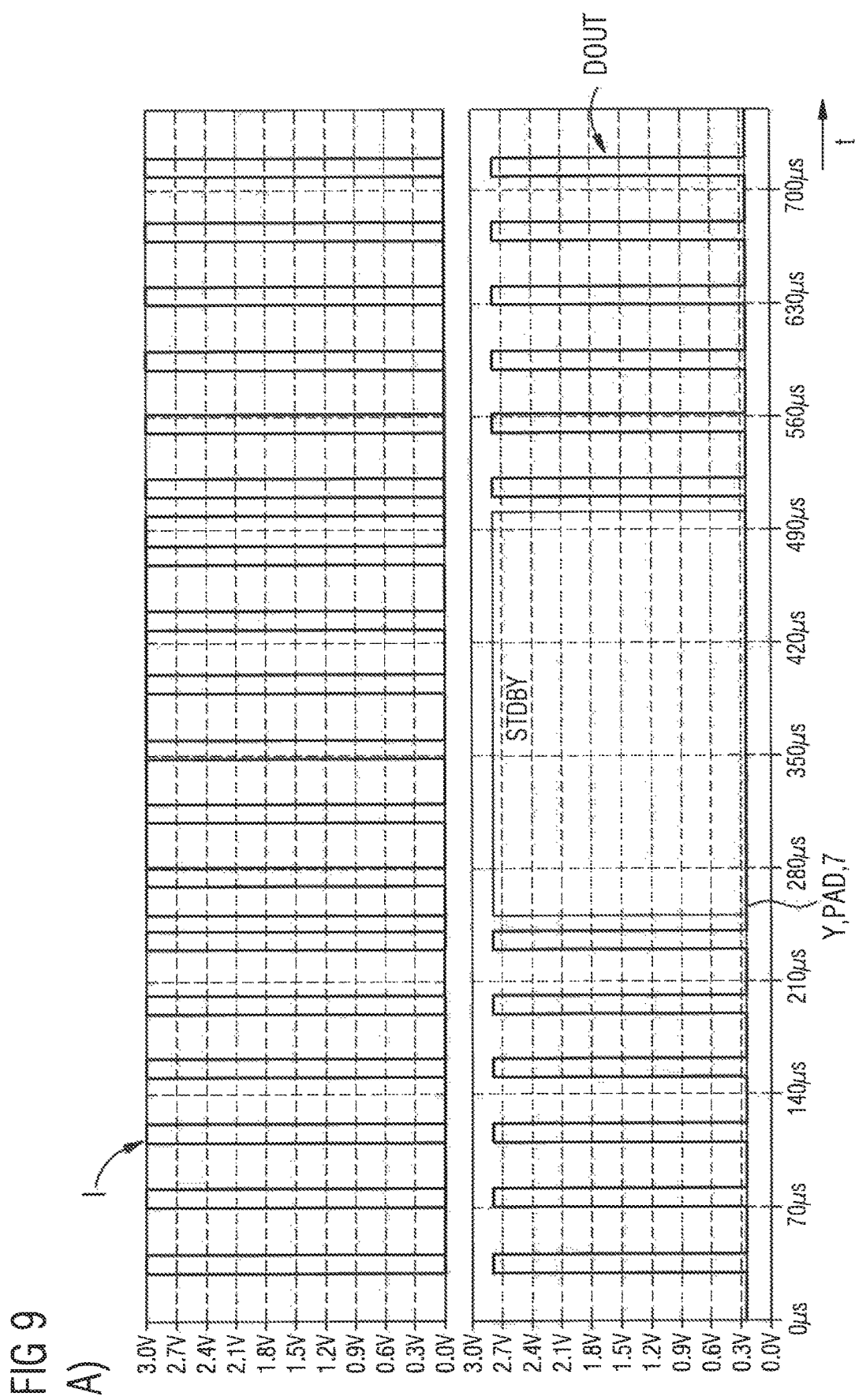

FIGS. 8 and 9 show another exemplary implementation. The waveforms of FIG. 9A correspond to FIG. 8A and those of FIG. 9B to FIG. 8B. FIG. 8A refers to the standby mode. FIG. 8B refers in particular to the mode when the sensor 1 is active.

An optical signal I is present on the sensor chip. In the active mode a data output signal DOUT is generated from the optical signal I. If the standby mode is requested by the activation unit 7, then there is no data output.

The values and circuits given in FIG. 8 as examples for the activation unit 7, the standby control circuit 62 and for the potential generator 63 can be used in the same way in all other exemplary aspects of the disclosure, for example, with a tolerance of not more than 50%.

Thus, with the operating method described here a standby circuit can be implemented with existing chip designs. An output line is thereby converted to an open-drain bidirectional connection. This is carried out, for example via an external or internal pull-up resistor, for example with a value in the order of magnitude of 10 kΩ, or with a pull-up current, which is optionally provided by the FPGA of the activation unit 7 and which has a value of around 130 µA, for example. In order to detect the signal for the standby request, this requires only a small logic block in the sensor 1 which is formed, for example, of only three inverters, a flip-flop and an AND gate.

The standby mode can thus be activated by the connection line for the envelope of the data OUT being pulled to low potential by the activation unit 7. In particular, this is only possible if the signal OUT for the data envelope is in the IDLE mode, so that no data envelope is generated. This should normally be the case in appropriate applications. The standby activation is preferably only possible after the output has been triggered once, since the initial state of the flip-flop after switching on is poorly defined.

Due to the circuit and mode of operation described here, an additional power consumption occurs, in particular by the pull-up resistor of approximately 300 µA, but only when the standby mode is activated. Delay times of the envelope OUT amount, in particular, to no more than 200 ns, for example with a capacitance of 30 pF and a load of 10 kΩ. A rise time of the rising edge is preferably determined by the driver intensity of the output driver and is, for example, around 20 ns.

The disclosure is not limited by the exemplary aspects of the disclosure. Rather, the disclosure includes each new feature, as well as any combination of features, which includes in particular every combination of features in the patent claims, even if this feature or this combination itself is not explicitly specified in the patent claims or exemplary aspects of the disclosure.

LIST OF REFERENCE SIGNS 1 sensor
2 sensor chip
21 chip upper side
22 chip side wall
3 carrier
31 carrier contact pad
4 encapsulated body
41 light inlet side
42 side wall
44 roughening
45 electrical contact point
5 bond wire
6 electronics unit
61 bidirectional connection line
62 standby control circuit (Standby)
63 potential generator (pull-up resistor)
64 data line (DOUT)
7 activation unit
10 3D position detection system
11 radiation source
12 user device
OUT active status line
I optical signal strength
R radiation
GND ground contact (Ground)
VDD supply voltage

The invention claimed is:

1. A sensor comprising
at least one sensor chip for detecting a radiation; and
an electronics unit with a digital, bidirectional connection line and with a standby control circuit, as well as with an active status line;
wherein
the connection line is configured to be connected to an external activation unit; and
the standby control circuit is configured to determine whether the connection line is externally addressed by the activation unit when the connection line is not addressed by the active status line, and precisely then to place the sensor in a standby mode.

2. The sensor as claimed in claim 1, wherein
the connection line is connected to the external activation unit;
the standby control circuit determines whether the connection line is externally addressed by the activation unit;
the standby control circuit determines whether the connection line is addressed by the active status line; and
the standby control circuit places the sensor in a standby mode precisely when the connection line is not addressed by the active status line and is addressed externally by the activation unit.

3. The sensor of claim 2,
wherein
the sensor is only bidirectionally connected by the connection line and is free of a communication interface with a communication protocol;
the connection line is connected to a potential generator;
a signal from the connection line is set to a low potential, either when the active status line is at a high potential or the activation unit on the connection line is active;
the signal from the connection line is set to a high potential via the potential generator precisely when the active status line is at a low potential and also the activation unit on the connection line is inactive; and
the standby mode is enabled only when the activation unit is active on the connection line.

4. The sensor of claim 3,
wherein the potential generator is a pull-up resistor, a pull-down resistor or an active current source with limited maximum current.

5. The sensor of claim 3, wherein the potential generator is integrated in the sensor.

6. The sensor of claim 3, wherein the potential generator is integrated in the activation unit, and
wherein the activation unit is a field-programmable logic gate array.

7. The operating method of claim 3, wherein one state on the potential generator is processed on the connection line in the electronics unit and/or the standby control circuit in a time-delayed manner, and
wherein the time delay is achieved by means of a non-inverting Schmitt trigger, by an RS flip-flop, by a low-pass filter, by an RC element and/or by a series circuit consisting of 2n inverters where n is a natural number.

8. The sensor of claim 2, wherein a signal on the active status line is identical to an envelope of a digitized signal of the sensor chip, and
wherein the activation unit sends the response of the connection line for setting the standby mode to the sensor as its only signal.

9. The sensor of claim 2, wherein the sensor has exactly four electrical connectors: the connection line, an additional data output line, two voltage terminals.

10. The sensor of claim 2, wherein the sensor has exactly three electrical connectors: the connection line, two voltage terminals.

11. The sensor of claim 2, wherein the connection line operates in an open-drain mode.

12. The sensor of claim 2, wherein a mean active time interval of the activation unit, with which the connection line is addressed by the active status line, is at least 200 µs.

13. The sensor of claim 2, wherein the standby control circuit comprises no more than 25 logic gates.

14. The sensor of claim 13,
wherein the standby control circuit contains exactly three inverters, exactly one RS flip-flop and exactly one AND gate and no other logic gates.

15. The sensor of claim 2, wherein
a 3D position detection system comprises at least one radiation source for generating the radiation to be detected by the plurality of sensors, and at least one user device;
the sensors are installed in the user device; and
the sensors are configured to determine angles between the user device and the radiation source, so that the angles can be used to determine a spatial position and orientation of the user device.

16. The sensor of claim 15,
wherein
the 3D position detection system comprises at least five of the sensor chips;

the radiation to be detected is pulsed, laminar and near-infrared laser radiation;

in operation the radiation is traversed beyond a spatial region in which the user device is located, so that a plurality of successive pulses of the laser radiation are incident on the sensor chip; and by the relevant sensor chip an intensity histogram of the incident pulses is detected, from which one of the angles with respect to the associated radiation source is determined; and the user device is a pair of virtual-reality glasses with at least one display for visualizing three-dimensional images.

17. The sensor of claim 1, wherein the sensor is configured to output along the bidirectional connection line a first signal representing a digitized output of the at least one sensor chip, and wherein the sensor is configured to output a second signal along the active status line, wherein the second signal represents an envelope or an inverse envelope of the first signal.

* * * * *